(12) United States Patent
Lawton

(10) Patent No.: US 6,287,748 B1
(45) Date of Patent: *Sep. 11, 2001

(54) SOLID IMAGING COMPOSITIONS FOR PREPARING POLYETHYLENE-LIKE ARTICLES

(75) Inventor: John Alan Lawton, Landenberg, PA (US)

(73) Assignee: DSM N.V., Heerlen (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/113,271

(22) Filed: Jul. 10, 1998

(51) Int. Cl.⁷ .................................................. G03F 7/028
(52) U.S. Cl. ........................ 430/280.1; 430/269; 522/11; 522/90; 522/100; 522/170
(58) Field of Search ............................ 430/280.1; 522/11, 522/90, 100, 170

(56) References Cited

U.S. PATENT DOCUMENTS

| | | | |
|---|---|---|---|
| 3,803,466 | 4/1974 | Starkey | 318/135 |
| 5,155,143 | * 10/1992 | Koleske | 522/170 |
| 5,476,748 | * 12/1995 | Steinmann et al. | 430/280.1 |
| 5,707,780 | * 1/1998 | Lawton et al. | 430/280.1 |

FOREIGN PATENT DOCUMENTS

| | | |
|---|---|---|
| 0822445A1 | * 2/1998 | (EP) . |
| 0837366 | 4/1998 | (EP) . |
| 0848292 | 6/1998 | (EP) . |
| 02-075618 | 3/1990 | (JP) . |
| 97/42549 | * 11/1997 | (WO) . |

OTHER PUBLICATIONS

Translation of European 0,822,445, Steinmann et al (PTO 2000–716), Dec. 1999.*

William Watkins et al., The Evolution of a Linear Induction Motor People Mover System, *WED Enterprises, Walt Disney Productions,* 133–136.

* cited by examiner

*Primary Examiner*—Cynthia Hamilton
(74) *Attorney, Agent, or Firm*—Pillsbury Winthrop LLP

(57) ABSTRACT

This invention discloses compositions adapted to produce, through solid imaging means, excellent quality objects having material properties that simulate the look and feel of polyethylene articles.

12 Claims, No Drawings

SOLID IMAGING COMPOSITIONS FOR PREPARING POLYETHYLENE-LIKE ARTICLES

FIELD OF THE INVENTION

This invention discloses compositions adapted to produce, through solid imaging means, excellent quality objects having material properties that simulate the look and feel of polyethylene articles.

BACKGROUND OF INVENTION

In the field of liquid-based solid imaging, alternatively known as stereolithography, compositions have been developed which are capable of generating solid objects having the properties of epoxies and/or acrylates. Solid imaging generated objects made from previous epoxy and/or acrylate compositions provide a prototypical representation of the physical shape of plastic articles made on a production basis out of materials such as ABS, nylon, polyethylene, polypropylene, etc. However, such compositions lack the material properties that give users of the prototypes a sense of look and feel for the object when produced in the production material. Such a lack of look and feel accuracy in product prototyping is not just an aesthetic issue. The look and feel of a prototype also has significant engineering, design, packaging, labeling, and advertising implications.

For example, squeeze bottles, such as those used for dispensing dish soap, are designed to be attractive in shape, easy to grasp, and easy to squeeze. Typically such bottles are made from polyethylene type polymers. Previous epoxy and/or acrylate compositions used in solid imaging were capable of producing articles that have the same attractive shape. However, the stiffness of the prototyped articles made from these materials was likely to mislead the designer and evaluator of the article relative to such issues as, for example, wall thickness and surface radius design. For example, a commercial solid imaging resin, Somos® 2100 (E. I. DuPont De Nemours, Inc., Wilmington, Del.), produces articles having lower stiffness than polyethylene. Bottles made from this material do not provide adequate resistance to squeezing such that enough friction occurs between a person's fingers and the bottle. A person holding a Somos® 2100 prototype bottle of liquid soap is likely to squeeze too hard in order to generate enough friction to keep the bottle from slipping. As a consequence, the soap is likely to be dispensed prematurely. The designer of the bottle might then be misled into making the wall thickness of the bottle greater in order to improve its stiffness. But such a design change would lead to-a bottle that is too stiff when manufactured with polyethylene. Similar problems are generated when other much stiffer epoxy and/or acrylate compositions are used to prototype articles such as bottles. A designer might be led to decrease the wall thickness of the bottle due to the stiffness. Or for example, since sharper radii may not feel as comfortable during squeezing when stiffer materials are used, the designer may be misled into re-designing the bottle with greater radii. This may affect the bottle squeezability when manufactured in polyethylene or may reduce the aesthetic appeal of the bottle shape.

Other examples may be made regarding the importance of appearance of an article when made out of certain materials. For example, use of a transparent prototype composition or an overly opaque composition may mislead those viewing the article into incorrect assumptions regarding appropriate packaging, labeling, coloring, and advertising of a product.

Other considerations when trying to utilize solid imaging for prototyping include photospeed, resistance to humidity, low potential for hydrolysis, similar coefficient of friction, dimensional accuracy, ability to span without supports during fabrication, and wide process latitude.

Japanese Patent Application Hei 2-75618 describes epoxy and acrylate compositions for use in optical molding. The compositions contain at least 40 wt % of alicyclic epoxy resin with at least two epoxy groups in each molecule.

U.S. Pat. No. 5,476,784 describes cationic epoxy and acrylate compositions for use in solid imaging. The compositions may comprise from 5–40% by weight of at least one OH-terminated polyether, polyester or polyurethane. In the examples given, the polyether polyols formulations provide lower elongation at break properties that the elongation at yield properties of most low-density polyethylenes. Additionally, the patent teaches that the epoxy content is to be from 40 to 80% of the formulation by weight. Compositions made with this epoxy content are likely to produce cured articles having a higher modulus than that of polyethylene.

SUMMARY OF THE INVENTION

This invention discloses photosensitive compositions comprising;
  (a) about 20–40% by weight of an epoxide-containing material;
  (b) about 5–40% by weight of acrylic material selected from aromatic acrylic material, cycloaliphatic acrylic material, or combinations thereof;
  (c) about 5–50% by weight of a reactive hydroxyl-containing material;
  (d) at least one cationic photoinitiator; and
  (e) at least one free-radical photoinitiator; with the proviso that upon exposure to actinic radiation an article is produced having the following properties:
    (i) a tensile break before yield stress or a tensile yield stress greater than 13 N/mm2;
    (ii) a tensile modulus in the range of about 180 to about 850 N/mm2;
    (iii) a tensile break elongation before yield or a tensile yield elongation greater than 6%; and
    (iv) a notched Izod impact strength greater than 50 J/m.

The invention also relates to a process for forming a three-dimensional article, said process comprising the steps:
  (1) coating a thin layer of a composition onto a surface;
  (2) exposing said thin layer imagewise to actinic radiation to form an imaged cross-section, wherein the radiation is of sufficient intensity to cause substantial curing of the thin layer in the exposed areas;
  (3) coating a thin layer of the composition onto the previously exposed imaged cross-section;
  (4) exposing said thin layer from step (3) imagewise to actinic radiation to form an additional imaged cross-section, wherein the radiation is of sufficient intensity to cause substantial curing of the thin layer in the exposed areas and to cause adhesion to the previously exposed imaged cross-section;
  (5) repeating steps (3) and (4) a sufficient number of times in order to build up the three-dimensional article; with the proviso the three-dimensional article has the following properties:
    (i) a tensile break before yield stress or a tensile yield stress greater than 13 N/mm2;
    (ii) a tensile modulus in the range of about 180 to about 850 N/mm2;
    (iii) a tensile break elongation before yield or a tensile yield elongation greater than 6%; and (iv) a notched Izod impact strength greater than 50 J/m.

The invention also relates to the above process wherein the composition comprises:

(a) about 20–40% by weight of an epoxide-containing material;

(b) about 5–40% by weight of an aromatic or cycloaliphatic acrylic material;

(c) about 5–50% by weight of a reactive hydroxyl-containing material;

(d) at least one cationic photoinitiator; and (e) at least one free-radical photoinitiator.

DESCRIPTION OF THE PREFERRED EMBODIMENTS

Liquid based Solid Imaging is a process wherein a photoformable liquid is coated into a thin layer upon a surface and exposed imagewise to actinic radiation such that the liquid solidifies imagewise. Subsequently, new thin layers of photoformable liquids are coated onto previous layers of liquid or previously solidified sections. Then the new layer is exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding liquid composition.

One of the most important advantages of the solid imaging process is the ability to rapidly produce actual objects that have been designed by computer aided design. A significant amount of progress has been made with compositions and processes that have been adapted to improve the accuracy of the objects produced. Also, composition developers have made significant progress toward improving individual properties such as the modulus or deflection temperature of the photohardened objects. However, attempts to simulate a particular set of physical properties of a common manufacturing material to such a degree that the simulation material could be easily mistaken for the simulated material, based upon look and feel properties, have been unsuccessful.

During the development of the compositions disclosed herein, it was noted that substantial changes in the look and feel of articles fabricated by the liquid solid imaging process could be attained by slight alterations in component concentration. Surprisingly it was found that by making these alterations in composition, articles could be made that had the look and feel of articles manufactured from polyethylene materials. Within the field of liquid solid imaging such a discovery is a first in that previous commercial compositions did not make articles that elicited a similar look and feel sense with regard to any other common plastic. It was then recognized that by tailoring the composition, the properties of polyethylene manufactured articles could be simulated. This potential therefore solved an oft expressed but unfilled need to produce prototypes that not only had the appearance of desired objects but also material properties that simulated the look and feel of the materials out of which production objects were destined to be manufactured.

In order to simulate a material in terms of look and feel, it is necessary to decide upon the appropriate appearance factors and physical properties. For example, in the field of liquid solid imaging the most commonly quoted fully cured part physical properties are the tensile stress, tensile modulus, elongation at break, flexural stress, flexural modulus, impact strength, hardness, and deflection temperature. Some of these physical properties, such as for example elongation at break, are not something that can be "felt" unless the material is deformed. Such physical properties are therefore not indicative of a good simulation material property.

In some cases, the characteristics of a material that serve to define the look and feel properties of a particular material are difficult to define. This is especially so in the case of how a materials looks. However, in the case of the instant invention a deliberate compositional choice was made such that articles fabricated through solid imaging means, when given various amounts of exposure to actinic radiation, had a similar color and light scattering characteristic as various grades of polyethylene. It was also found that changing the actinic exposure can also modify the feel properties of the articles manufactured from the composition by the solid imaging process. That is, when lower actinic exposures are given during the solid imaging process, the articles feel more like lower density polyethylene articles but when higher actinic exposures are given, the articles feel more like medium density polyethylene articles.

A stress-strain curve, also known as a deformation curve, shows the relationship between the stress or load on a sample and the strain or deformation that results. The tensile stress-strain curve results when the sample is under tension. The flexural stress-strain curve is a result of bending the sample. It is considered here that the tensile properties are best representative of how the articles feel.

At the beginning of stress, the stress-strain relationship is roughly linear. The "tensile modulus" (or the flexural modulus) is defined as the slope of the curve in this linear region. As the sample continues to be stressed, the stress-strain curve tends to become less linear until a maximum is reached. This maximum point is called the "yield point" and is generally defined as the region where a large increment of extension occurs under constant load. The "yield stress" is the stress at the yield point. The "elongation at yield" is the percent elongation at the yield point. Some materials exhibit increased stress and strain capability beyond the yield point. The point at which the sample breaks is where the values of "break stress" and a% elongation at breaks can be ascertained. Some samples may break prior to the yield point or at the yield point.

In the case of break before yield, only the break stress and % elongation at break values are reported. It is possible for the break stress to be a lower or higher value than the yield stress. All tensile properties as discussed herein were measured according to ASTM Test D-638M, except that for the example formulations and the comparative example formulations the humidity was not controlled.

By far, the most important property that relates to what is felt when handling a material, is the tensile modulus. This is representative of the feeling of stiffness.

A second important property is that of the elongation of the material. When a simulation of a material is handled and flexed, it should not break or permanently distort if the material being simulated does not break or distort with such handling. With plastics there is considerable debate relating to the point at which a sample under stress transitions from an elastic mode to a plastic mode of behavior. However, most would agree that when a material begins to yield, its behavior is plastic and that any handling that brings a sample past its yield point will leave the sample permanently distorted. For the purposes of this invention the tensile elongation at yield serves to help define this aspect of the feel of a material. If a material breaks before its yield, it must have a tensile elongation at break that is greater than or equal to the tensile elongation at yield of the material being simulated or it is not an acceptable simulation material. Ideally a simulation material should have an elongation at yield that is about the same or greater than the elongation at yield of a simulated material.

A third important physical property is the tensile stress. For the purposes of this invention, a tensile stress for a material that breaks at or before its yield is an important property for simulation purposes. Simulation materials that have a yield stress or break stress (before yield) that is lower than the lowest yield stress or break stress (before yield) of a simulated material are usually unsuitable simulation materials.

Another important physical property is that of the sense of feel for inherent toughness. The Izod impact strength provides a good measure of the toughness of a material. A good simulation material will have toughness in a range that is close to that of the simulated material. For the discussion herein, the impact strength is measured by the notched Izod test, according to ASTM Test D-256A.

In general, useful articles are not really used to the point of breaking. For example, if a squeeze bottle is made of a material that breaks during normal use it will have little value. And in general, useful articles are not often used such that they are stressed past their yield capabilities. For example, if bridges were designed to withstand normal loads, such as a car, which induced stresses in support members exceeding the yield point, the bridge would increase in sag for every car that passed over it. Exceptions may be found for some applications such as, for example, living hinges. In these cases, often the first use of the article induces a stress that exceeds the yield of the material, but subsequent stresses remain for the most part within the elastic range of the material. For the purposes of the instant invention, material property values relating to the break of a material, for a material having a yield point, are of little interest in terms of simulating the look and feel of a simulated material.

The tensile stress usually quoted is the maximum tensile stress, which is either the stress at yield or the stress at break. If the material breaks before it yields, the tensile stress at break of the simulation material should be compared to the tensile yield stress of the simulated material. If the simulation material exhibits a yield point, the tensile yield stress of the simulation material should be compared to the tensile yield stress of the simulated material. In the case of low to medium density polyethylene, the tensile stress at yield is 13–28 N/mm2. Simulation materials which have a break tensile stress (before yield) or a tensile yield stress of less than 13 N/mm2, are probably not suitable as a simulation material for low to medium density polyethylene.

The tensile modulus (and/or the flexural modulus) is probably the most important physical property with respect to the feel of a material. People can generally feel the stiffness of a material and can tell if the material is not stiff enough or if the material is too stiff. This is because the modulus is a material property that is determined in the working range of a material (i.e. prior to plastic deformation of the material) and is a material property that can be felt or measured at relatively low stress levels. In general, a suitable simulation material has a tensile modulus which is within the range of moduli of the simulated material. Low density to medium density polyethylene has a tensile modulus range of from approximately 260 to 520 N/mm2. It has been found that simulation compositions resulting in parts having a tensile modulus in the range of about 180 to about 850 N/mm$^2$ are suitable simulation materials. Parts having a modulus below that range are generally too soft and pliable to have any utility as a polyethylene simulation. Conversely, parts having a modulus above that range are too stiff.

Preferably, the compositions result in parts having a tensile modulus in the range of about 220 to about 650 N/mm$^2$.

In the case of the most preferred simulation material for polyethylene, it has been discovered that variations in the exposure during the solid imaging process lead to significant variations in the tensile modulus. For example, by doubling the exposure of this material during the solid imaging process the tensile modulus doubled but the elongation at yield remained unchanged. This is extremely advantageous for a simulation material since the modulus can be varied over a range that very closely matches the modulus range of the simulated material. Such a simulation material is therefore adaptable to simulate various molecular weights and grades of polyethylene, for example.

The elongation properties of a simulation material are also important. If the simulation material has a tensile elongation at break that is lower than the minimum tensile elongation at yield of the simulated material, it is regarded as not suitable. If the material has a yield point, the tensile elongation at yield of the simulation material is compared with the tensile elongation at yield of the simulated material. If the material does not have a yield point, the tensile elongation at break of the simulation material is compared with the tensile elongation at yield of the simulated material. Suitable simulation materials have tensile elongation at yield or tensile elongation at break (before yield) values that equal or exceed the tensile elongation at yield values of the simulation material. Low to medium density polyethylene has a tensile elongation at yield range of 6–8%. Therefore a suitable simulation material for polyethylene will have a tensile elongation at break (before yield) or a tensile elongation at yield of greater than 6%.

The impact resistance of a simulation material relative to the impact resistance of a simulated material is also of some importance. For example, it is not unusual for someone handling an object to knock the object against the corner of a table. From such treatment a feel of the materials toughness and sound qualities (deadening, ringing, etc) can be garnered. For the purposes of this patent, a suitable simulation material will have an Izod impact strength that is nearly as strong as the Izod impact strength of the simulation material. Low to medium density polyethylene has a notched Izod Impact Strength of 53.4 J/m to No Break. Therefore a suitable simulation material for low to medium density polyethylene has Notched Izod Impact Strength of at least 50 J/m.

The appearance of a simulation material is also an important consideration. Low to medium density polyethylene has a cloudy appearance. Therefore a suitable simulation material for low to medium density polyethylene should also have a cloudy appearance and as much as possible for UV cured materials, minimum color.

The compositions of the invention generally comprise an epoxide-containing material, a free-radical polymerizable aromatic and/or cycloaliphatic acrylic material, a reactive hydroxyl-containing material, a cationic photoinitiator and a free-radical photoinitiator.

The epoxide-containing materials that are used in the compositions, according to this invention, are compounds that possess on average at least one 1,2-epoxide group in the molecule. By "epoxide" is meant the three-membered ring

The epoxide-containing materials, also referred to as epoxy materials, are cationically curable, by which is meant that polymerization and/or crosslinking and other reaction of the epoxy group is initiated by cations. The materials can be monomers, oligomers or polymers and are sometimes referred to as "resins." Such materials may have an aliphatic, aromatic, cycloaliphatic, araliphatic or heterocyclic structure; they comprise epoxide groups as side groups, or those groups form part of an alicyclic or heterocyclic ring system. Epoxy resins of those types are generally known and are commercially available.

The epoxide-containing material (a) may be a solid or a liquid which is soluble or dispersible in the remaining components. It is preferred that the epoxide-containing material comprise at least one liquid component such that the combination of materials is a liquid. In the preferred case, the epoxide-containing material can be a single liquid epoxy material, a combination of liquid epoxy materials, or a combination of liquid epoxy material(s) and solid epoxy material(s) which is soluble in the liquid.

Examples of suitable epoxy materials include polyglycidyl and poly(-methylglycidyl) esters of polycarboxylic acids. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. It is likewise possible to use carboxy-terminated adducts, for example, of trimellitic acid and polyols, such as, for example, glycerol or 2,2-bis(4-hydroxycyclohexyl)propane.

Suitable epoxy materials also include polyglycidyl or poly(-methylglycidyl) ethers obtainable by the reaction of a compound having at least two free alcoholic hydroxy groups and/or phenolic hydroxy groups and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane.

The epoxy compounds may also be derived from mono nuclear phenols, such as, for example, from resorcinol or hydroquinone, or they are based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs.

Suitable epoxy materials also include poly(N-glycidyl) compounds are, for example, obtainable by dehydrochlorination of the reaction products of epichlorohydrin with amines that comprise at least two amine hydrogen atoms, such as, for example, n-butylamine, aniline, toluidine, m-xylene diamine, bis(4-aminophenyl)methane or bis(4-methylaminophenyl)methane. The poly(N-glycidyl) compounds also include, however, N,N'-diglycidyl derivatives of cycloalkyleneureas, such as ethyleneurea or 1,3-propyleneurea, and N,N'-diglycidyl derivatives of hydantoins, such as of 5,5-dimethylhydantoin.

Examples of suitable epoxy materials include poly(S-glycidyl) compounds which are di-S-glycidyl derivatives which are derived from dithiols, such as, for example, ethane-1,2-dithiol or bis(4-mercaptomethylphenyl) ether.

Examples of suitable epoxy materials include epoxy compounds in which the epoxy groups form part of an alicyclic or heterocyclic ring system are bis(2,3-epoxycyclopentyl) ether, 2,3-epoxy cyclopentyl glycidyl ether, 1,2-bis(2,3-epoxycyclopentyloxy)ethane, bis(4-hydroxycyclohexyl) methane diglycidyl ether, 2,2-bis(4-hydroxycyclohexyl) propane diglycidyl ether, 3,4-epoxycyclohexylmethyl-3,4-epoxycyclohexane, 3,4-epoxy-6-methylcyclohexyl-methyl-3,4-epoxy-6-methylcyclohexanecaboxylate, di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanedioldi-(3,4-epoxycyclohexylmethyl)ether, vinylcyclohexene dioxide, dicyclopentadiene diepoxide, or 2-(3,4-epoxycyclohexyl-5,5-spiro-3,4-epoxy)cyclohexane-1,3-dioxane.

It is, however, also possible to use epoxy resins in which the 1,2-epoxy groups are bonded to different hetero atoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl)propane.

In addition, liquid pre-reacted adducts of such epoxy resins with hardeners are suitable for epoxy resins. It is of course also possible to use mixtures of epoxy materials in the compositions according to the invention.

Preferred epoxy materials are cycloaliphatic diepoxides. Especially preferred are bis(4-hydroxycyclohexyl)methane diglycidyl ether, 2,2-bis(4-hydroxycyclohexyl)propane diglycidyl ether, 3,4-epoxycyclohexylmethyl-3,4 epoxycyclohexanecarboxylate, 3,4-epoxy-6-methyl-cyclohexylmethyl-3,4-epoxy-6-methylcyclohexanecarboxylate,di-(3,4-epoxycyclohexylmethyl)hexanedioate, di-(3,4-epoxy-6-methyl-cyclohexylmethyl)hexanedioate, ethylenebis(3,4-epoxycyclohexanecarboxylate), ethanediol-di-(3,4-epoxycyclohexylmethyl) ether, and 2-(3,4-epoxycyclohexyl-5,5-spiro-3,4-epoxy)cyclohexane-1,3-dioxane.

The epoxy materials can have molecular weights which vary over a wide range. In general, the epoxy equivalent weight, i.e., the number average molecular weight divided by the number of reactive epoxy groups, is preferably in the range of about 60 to about 1000.

The free-radical polymerizable acrylic materials that are used in the composition, according to this invention, are aromatic and/or cycloaliphatic compounds that have, on average, at least one acrylic group which can be either the free acid or an ester. By "acrylic" is meant the group —$CH_2$=$CR^1$—$CO_2^-$, where $R^1$ can be hydrogen or methyl. By "(meth)acrylate" is meant a acrylate, methacrylate or combinations thereof. The acrylic materials undergo polymerization and/or crosslinking reactions initiated by free radicals. The acrylic materials can be monomers, oligomers or polymers. It is preferred that the acrylic material be a monomer or oligomer.

Suitable as the acrylic component are, for example, the diacrylates of cycloaliphatic or aromatic diols, such as 1,4-dihydrox methylcyclohexane, 2,2-bis(4-hydroxycycyclohexyl)propane, bis(4hydroxycyclohexyl) methane, hydroquinone, 4,4-dihydroxybiphenyl, bisphenol A, bisphenol F, bisphenol S, ethoxylated or propoxylated bisphenol A, ethoxylated or propoxylated bisphenol F, or ethoxylated or propoxylated bisphenol S. Such acrylates are known and some of them are commercially available.

Preferred are compositions comprising as the acrylic component a compound of formula I, II, III or IV

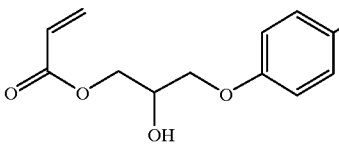

(I)

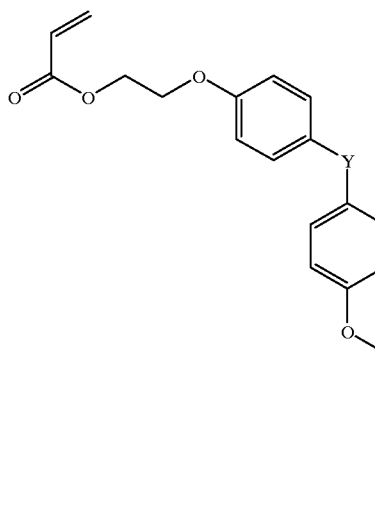

(II)

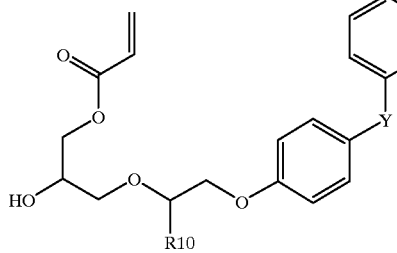

(III)

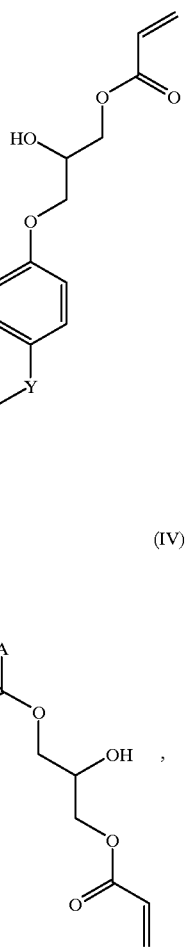

(IV)

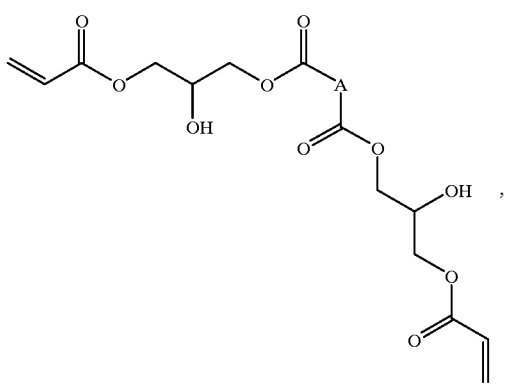

wherein
Y is a direct bond, C1–C6 alkylene, —S—, —O—, —SO—, —SO2—, or —CO—, R10 is a C1–C8 alkyl group, a phenyl group that is unsubstituted or substituted by one or more C1–C4 alkyl groups, hydroxy groups or halogen atoms, or a radical of the formula CH$_2$—R11, wherein R11 is a C1–C8 alkyl group or a phenyl group, and A is a radical of the formula

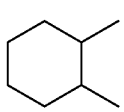 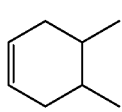

or,

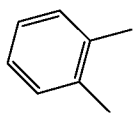

or comprising as the acrylic component a compound of any one of formulae Va to Vd, (Va)

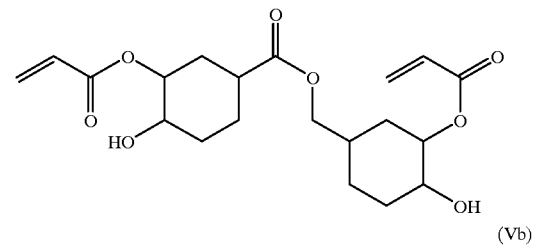

(Vb)

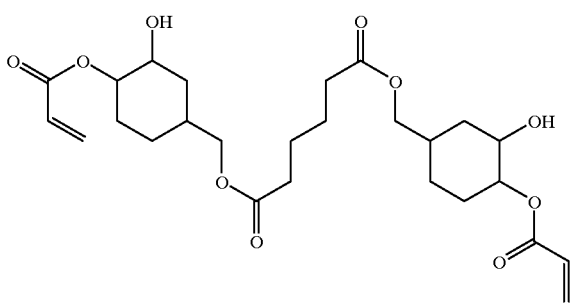

and the corresponding isomers, (Vc)

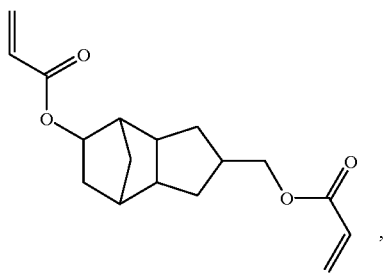

or, (Vd)

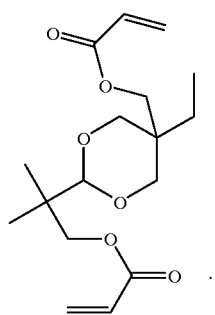

If a substituent is C1–C4 alkyl or C1–C8 alkyl, it may be straight-chained or branched. A C1–C4 alkyl may be, for example, methyl, ethyl, n-propyl, isopropyl, n-butyl, sec-butyl, isobutyl or tert-butyl, and a C1–C8 alkyl may additionally be, for example, the various pentyl, hexyl, heptyl, or octyl isomers.

If a substituent is halogen, it is fluorine, chlorine, bromine, or iodine, but especially chlorine or bromine.

If a substituent is C1-C6 alkylene it is, for example, methylene, ethylene, propylene (methylethylene), trimethylene, 1,1-propanediyl, 2,2-propanediyl, tetramethylene, ethylmethylene, 1,1-butanediyl, 2,2-butanediyl, pentamethylene or hexamethylene. The alkylene radicals may also be substituted by halogen atoms. Examples of halogenated alkylene radicals are —$C(CCl_3)_2$— and —$C(CF_3)_2$—.

Especially preferred in the compositions are compounds of the formula V, VI or VII wherein Y is —$CH_2$— or —$(CH_3)_2$—. Also especially preferred are compounds of formula VII wherein R10 is n-butyl, phenyl, n-butoxymethyl, or phenoxymethyl.

Suitable as aromatic tri(meth-)acrylates are, for example, the reaction products of triglycidyl ethers of trihydric phenols, and phenol or cresol novolacs having three hydroxy groups with (meth)-acrylic acid. Compositions wherein the acrylic component is an acrylate of bisphenol A diepoxide such as Ebecryl® 3700 from UCB Chemical Corporation, Smyrna, Ga. or an acrylate of 1,4-cyclohexanedimethanol are especially preferred for compositions used in this invention.

In addition to the aromatic or cycloaliphatic acrylic material (b), other acrylic materials can be present. Liquid poly(meth-)acrylates having functionality of greater than 2 which may, where appropriate, be used in the compositions according to the invention. These can be, for example, tri-, tetra-, or penta-functional monomeric or oligomeric aliphatic, (meth)acrylates.

Suitable as aliphatic polyfunctional (meth)acrylates are, for example, the triacrylates and trimethacrylates of hexane-2,4,6-triol, glycerol, or 1,1,1-trimethylolpropane, ethoxylated or propoxylated glycerol, or 1,1,1-trimethylolpropane and the hydroxy group-containing tri(meth)acrylates which are obtained by the reaction of triepoxy compounds, such as, for example, the triglycidyl ethers of the mentioned triols, with (meth)acrylic acid. It is also possible to use, for example, pentaerythritol tetraacrylate, bistrimethylolpropane tetra-acrylate, pentaerythritol monohydroxytri(meth) acrylate, or dipentaerythritol monohydroxypenta(meth) acrylate.

It is also possible to use hexafunctional urethane (meth) acrylates. Those urethane (meth)acrylates are known to the person skilled in the art and can be prepared in known manner, for example by reacting a hydroxy-terminated polyurethane with acrylic acid or methacrylic acid, or by reacting an isocyanate-terminated prepolymer with hydroxyalkyl (meth)acrylates to follow the urethane (meth)acrylate. Also useful are (meth)acrylates such as tris(2-hydroxyethyl) isocyanurate triacrylate.

The reactive hydroxyl-containing material which is used in the present invention may be any organic material having hydroxyl functionality of at least 1, and preferably at least 2. The material may be a liquid or a solid that is soluble or dispersible in the remaining components. The material should be substantially free of any groups which inhibit the curing reactions, or which are thermally or photolytically unstable.

Preferably the organic material contains two or more primary or secondary aliphatic hydroxyl groups, by which is meant that the hydroxyl group is bonded directly to a non-aromatic carbon atom. The hydroxyl group may be internal in the molecule or terminal. Monomers, oligomers or polymers can be used. The hydroxyl equivalent weight, i.e., the number average molecular weight divided by the number of hydroxyl groups, is preferably in the range of about 31 to 5000.

Representative examples of suitable organic materials having a hydroxyl functionality of 1 include alkanols, monoalkyl ethers of polyoxyalkyleneglycols, monoalkyl ethers of alkylene-glycols, and others.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−)- 2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyl-tetrahydro-pyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; and hydroxy-terminated polyethers.

Preferred hydroxyl-containing monomers are 1,4-cyclohexanedimethanol and aliphatic and cycloaliphatic monohydroxy alkanols.

Preferred hydroxyl-containing oligomers and polymers include hydroxyl and hydroxyl/epoxy functionalized polybutadiene, polycaprolactone diols and triols, ethylene/butylene polyols, and combinations thereof. Preferred examples of polyether polyols are polypropylene glycols of various molecular weights and glycerol propoxylate-B-ethoxylate triol. Especially preferred are linear and branched polytetrahydrofuran polyether polyols available in various molecular weights, such as for example 250, 650, 1000, 2000, and 2900 MW.

In the compositions according to the invention, any type of photoinitiator that, upon exposure to actinic radiation, forms cations that initiate the reactions of the epoxy material (s) can be used. There are a large number of known and technically proven cationic photoinitiators for epoxy resins that are suitable. They include, for example, onium salts with anions of weak nucleophilicity. Examples are halonium salts, iodosyl salts or sulfonium salts, such as are described in published European patent application EP 153904, sulfoxonium salts, such as described, for example, in published European patent applications EP 35969, 44274, 54509, and 164314, or diazonium salts, such as described, for example, in U.S. Pat. Nos. 3,708,296 and 5,002,856. Other cationic photoinitiators are metallocene salts, such as described, for example, in published European applications EP 94914 and 94915.

A survey of other current onium salt initiators and/or metallocene salts can be found in "UV-Curing, Science and Technology", (Editor S. P. Pappas, Technology Marketing Corp., 642 Westover Road, Stanford, Conn., U.S.A.) or "Chemistry & Technology of UV & EB Formulation for Coatings, Inks & Paints", Vol. 3 (edited by P. K. T. oldring).

Preferred cationic photoinitiators are compounds of formula VI, VII, or VIII below,

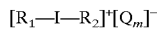    VI

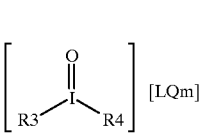    (VII)

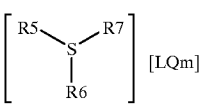    (VIII)

wherein:

$R_1$, $R_2$, $R_3$, $R_4$, $R_5$, $R_6$, and $R_7$ are each independently of the others C6–C18 aryl that is unsubstituted or substituted by suitable radicals, L is boron, phosphorus, arsenic, or antimony, Q is a halogen atom or some of the radicals Q in an anion $LQ_m^-$ may also be hydroxy groups, and m is an integer that corresponds to the valence of L plus 1.

Examples of C6–C18 aryl are phenyl, naphthyl, anthryl, and phenanthryl. Any substituents present for suitable radicals are alkyl, preferably C1–C6 alkyl, such as methyl, ethyl, n-propyl, isopropyl, n-butyl, sec-butyl, isobutyl, tert-butyl, or the various pentyl or hexyl isomers, alkoxy, preferably C1–C6 alkoxy such as methoxy, ethoxy, propoxy, butoxy, pentyloxy, or hexyloxy, alkylthio, preferably C1–C6 alkylthio, such as methylthio, ethylthio, propylthio, butylthio, pentylthio, or hexylthio, halogen, such as fluorine, chlorine, bromine, or iodine, amino groups, cyano groups, nitro groups, or arylthio, such as phenylthio.

Examples of preferred halogen atoms Q are chlorine and especially fluorine. Preferred anions $LQ_m^-$ are $BF_4^-$, $PF_6^-$, $AsF_6^-$, $SbF_6^-$, and $SbF_5(OH)^-$.

Especially preferred are compositions comprising as the cationic photoinitiator a compound of formula VIII wherein R5, R6 and R7 are aryl, aryl being especially phenyl or biphenyl, or mixtures of those two compounds.

Also preferred are compositions comprising as the cationic photoinitiator component compounds of formula (IX)

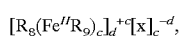

wherein, c is 1 or 2, d is 1,2,3,4 or 5,

X is a non-nucleophilic anion, especially $PF_6^-$, $AsF_6^-$, $SbF_6^-$, $CF_3SO_3^-$, $C_2F_5SO_3^-$, n-$C_3F_7SO_3^-$, n-$C_4F_9SO_3^-$, -n-$C_6F_{13}SO_3^-$, or n-$C_8F_{17}SO_3^-$, R8 is a pi-arene, and R9 is an anion of a pi-arene, especially a cyclopentadienyl anion.

Examples of pi-arenes as R8 and anions of pi-arenes as -R9 are to be found in published European patent application EP 94915. Examples of preferred pi-arenes as R8 are toluene, xylene, ethylbenzene, cumene, methoxybenzene, methylnaphthalene, pyrene, perylene, stilbene, diphenylene oxide and diphenylene sulfide. Especially preferred are cumene, methylnaphthalene, or stilbene.

Examples of non-nucleophilic anions $X^-$ are $FSO_3^-$, anions of organic sulfonic acids, of carboxylic acids, or anions $LQ_m^-$, as already defined above.

Preferred anions are derived from partially fluoro- or perfluoro-aliphatic or partially fluoro- or perfluoro-aromatic carboxylic acids, or especially from partially fluoro- or per-fluoro-aliphatic or partially fluoro or perfluoro-aromatic organic sulfonic acids, or they are preferably anions $LQ_m^-$. Examples of anions X are $BF_4^-$, $PF_6^-$, $AsF_6^-$, $SbF_6^-$, $SbF_5(OH)^-$, $CF_3SO_3^-$, $C_2F_5SO_3^-$, n-$C_3F_7SO_3^-$, n-$C_4F_9SO_3^-$, n-$C_6F_{13}SO_3^-$, n-$C_8F_{17}SO_3^-$, $C_6F_5SO_3^-$, phosphorus tungstate, or silicon tungstate. Preferred are $PF_6^-$, $AsF_6^-$, $SbF_6^-$, $CF_3SO^-$, $C_2F_5SO_3^-$, n-$C_3F_7SO_3^-$, n-$C_4F_9SO_3^-$, n-$C_6F_{13}SO_3^-$, and n-$C_8F_{17}SO_3^-$.

The metallocene salts can also be used in combination with oxidizing agents. Such combinations are described in published European patent application EP 126712.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are 2benzo[g,h,i]perylene, 1,8-diphenyl-1,3,5,7-octatetraene, and 1,6-diphenyl-1,3,5-hexatriene as described in U.S. Pat. No. 5,667,937. It will be recognized that an additional factor in the choice of sensitizer is the nature and primary wavelength of the source of actinic radiation.

In the compositions according to the invention, any type of photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tert-butylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin® TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4"'methyl thiophenyl-1-di(trichloromethyl)-3,5 S-triazine, S-triazine-2-(stylbene)-4,6-bis-trichloromethyl, and paramethoxy stiryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide is used as photoinitiator.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European-patent application EP 223587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula

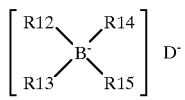

wherein $D^+$ is a cationic dye and $R_{12}$, $R_{13}$, $R_{14}$, and $R_{15}$ are each independently of the others arkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in published European patent application EP 223587.

Especially preferred is the free-radical photoinitiator 1-hydroxyphenyl ketone, which produces parts having the least amount of yellowing after final cure and provides articles which most closely simulate polyethylene.

Other additives which are known to be useful in solid imaging compositions may also be present in the composition of the invention. Stabilizers are often added to the compositions in order to prevent a viscosity build-up during usage in the solid imaging process. The preferred stabilizers are described in U.S. Pat. No. 5,665,792. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives include dyes, pigments, fillers, wetting agents, photosensitizers for the free-radical photoinitiator, leveling agents, surfactants and the like.

The compositions of the invention generally comprise from about 20% by weight to less than about 40% by weight of the epoxide-containing material, based on the total weight of the composition.

It is sometimes beneficial to describe the compositions in terms of equivalents or milliequivalents of epoxy material per 100 grams of total composition. The epoxy equivalent weight can be derived by dividing the number of epoxy groups contained within a molecule by the molecular weight of the molecule. The total epoxy equivalent wieght of a composition is determined by first calculating the epoxy content of each component, i.e., epoxide-containing material, epoxy-acrylate, etc. The individual component epoxy equivalent weihgts are weight averaged for the entire composition. It is preferred that the compositions comprise from about 250 to about 350 milliequivalents of epoxy per 100 grams of composition.

The compositions of the invention preferably comprise from about 5% to about 45% by weight of free-radical polymerizable acrylic material, based on the total weight of the composition. It is most preferred that the acrylic be an aromatic and/or cycloaliphatic diacrylate or dimethacrylate.

The compositions of the invention preferably comprise from about 5% to about 50% by weight of reactive hydroxy-containing material, based on the total weight of the composition, more preferably from about 20% to about 30% by weight.

It is sometimes beneficial to describe the compositions in terms of equivalents or milliequivalents of hydroxyl-containing material per 100 grams of total composition. The hydroxyl equivalent weight can be derived by dividing the number of hydroxyl groups contained within a molecule by the molecular weight of the molecule. The total number of equivalent of hydroxyl in a composition is determined by first calculating the hydroxyl content of each component, i.e., epoxide-containing material, epoxy-acrylate, polyol, initiator, etc. The individual component hydroxyl equivalent weights are weight averaged for the entire composition. All hydroxyls are assumed to be reactive, regardless of steric hindrance. It is preferred that the composition comprise from about 140 to about 180 milliequivalents of reactive hydroxy-containing material per 100 grams of composition. It is most preferred that the ratio of epoxy equivalents to hydroxyl equivalents be in the range of from about 1.5 to about than 2.5; most preferably 1.9 to 2.4.

The compositions of the invention preferably comprise from about 0.2 to about 10% by weight of cationic photoinitiator, based on the total weight of the composition.

The compositions of the invention preferably comprise from about o.01 to about 10% by weight of free-radical photoinitiator, based on the total weight of the composition.

The compositions of the invention can be prepared according to conventional procedures. In general, the components are combined by mixing in any suitable mixing apparatus. In some cases, some components can be pre-mixed before adding to the total composition. In some cases, the mixing is carried out in the absence of light. In some cases, the mixing is carried out with some heating, generally at temperatures that range from about 30° C. to about 60° C.

The process for producing three-dimensional articles from the compositions of the invention, as discussed above, generally involves exposure of successive thin layers of the liquid composition to actinic radiation. A thin layer of the photosensitive composition of the invention is coated onto a surface. This is most conveniently done if the composition is a liquid. However, a solid composition can be melted to form a layer. The thin layer is then exposed imagewise to actinic radiation. The radiation must provide sufficient exposure to cause substantial curing of the photosensitive composition in the exposed areas. By "substantial curing" it is meant that the photosensitive composition has reacted to an extent such that the exposed areas are physically differentiable from the unexposed areas. For liquid, gel or semi-solid photosensitive compositions, the cured areas will have hardened or solidified to a non-fluid form. For solid photosensitive compositions, the exposed areas will have a higher melting point than the non-exposed areas. Preferably, the exposure is such that portions of each successive layer are adhered to a portion of a previously exposed layer or support region, or to portions of a platform surface. This first exposure step forms a first imaged cross-section. An additional (second) thin layer of photosensitive composition is then coated onto the first imaged cross-section and imagewise exposed to actinic radiation to form an additional (second) imaged cross-section. These steps are repeated with the "nth" thin layer of photosensitive composition being coated onto the "(n–)th" imaged cross-section and exposing to actinic radiation. The repetitions are carried out a sufficient number of times to build up the entire three-dimensional article.

The radiation is preferably in the range of 280–650 nm. Any convenient source of actinic radiation can be used, but lasers are particularly suitable. Useful lasers include HeCd, argon, nitrogen, metal vapor, and NdYAG lasers. The exposure energy is preferably in the range of about 10–75 mJ/cm$^2$. Suitable methods and apparatus for carrying out the exposure and production of three-dimensional articles have been described in, for example, U.S. Pat. Nos. 4,987,044, 5,014,207, and 5,474,719, which teaches the use of pseudoplastic, plastic flow, thixotropic, gel, semi-solid and solid photopolymer materials in the solid imaging process.

In general, the three-dimensional article formed by exposure to actinic radiation, as discussed above, is not fully cured, by which is meant that not all of the reactive material in the composition has reacted. Therefore, there is often an additional step of more fully curing the article. This can be accomplished by further irradiating with actinic radiation, heating, or both. Exposure to actinic radiation can be accomplished with any convenient radiation source, generally a Uw light, for a time ranging from about 10 to over 60 minutes. Heating is generally carried out at a temperature in the range of about 75–150° C., for a time ranging from about 10 to over 60 minutes.

EXAMPLES

The components 3,4-epoxycyclohexylmethyl-3,4- epoxycyclohexane carboxylate (epoxy); polytetrahydrofuran linear chain (1000 mw) (polyTHF); 1,4-cyclohexanedimethanol (CHDM); 1-hydroxycyclohexyl phenyl ketone (free-radical initiator, FRI-1); 2-hydroxy-1-(4-(2-hydroxyethoxy)phenyl)-2-methyl-1-propanone (free-radical initiator, FRI-2); trimethylolpropane triacrylate (TMPTA); and 2,2-dinethoxy-2-phenylacetophenone (free-radical initiator, FRI-3) are available from Aldrich Chemical Company Inc (Milwaukee, Wis.). The acrylate ester of bisphenol-A epoxy (Ebecryl) is available from UCB Chemicals Corp. (Smyrna, Ga.) as EbecrylO 3700. The 1,4-cyclohexanedimethanol diacrylate esters (CHDMDA) are sold by Sartomer Company (Exton, Pa.). The mixed triarylsulfonium hexafluoroantimonate salts in 50% by -aweight propylene carbonate (cationic initiator, CatI) is sold by Union Carbide Chemicals and Plastics Company Inc. (Danbury, Conn.). Somoss 2100, 3110, and 7100 are commercial products sold by E. I. du Pont de Nemours and Company (Wilmington, Del.).

The individual components were weighed out, combined, then heated to 50° C. and mixed for several hours until all the ingredients were completely dissolved.

For all formulations, the exposure-working curve of the formula was determined using methods well known in the art. The working curve is a measure of the photospeed of the particular material. It represents the relationship between the thickness of a floating layer, scanned on the surface of the photopolymer in a vat or petri-dish, produced as a function of the exposure given. Parts were fabricated by forming a series of 6 mil (0.15 mm) coated layers, and giving enough imagewise exposure to each layer to create a cure that would correspond to a 10 mil (0.254 mm) working curve thickness.

The exposures used to create the tensile and Izod impact test parts are given in Table 2. Unless otherwise indicated, all parts were fabricated using an Argon Ion laser operating with an output of 351 nm.

After the parts were formed, they were cleaned in a solvent, allowed to dry and then fully cured. All parts, except the Somos® 2100 part, were given a UV postcure for 60 minutes in a Post Curing Apparatus, manufactured by 3D Systems, Inc. (Valencia, Calif.). The Somos® 2100 part was postcured in an oven for 30 minutes at 150 degrees C then UV postcured for 30 minutes.

All tensile properties were measured according to ASTM Test D-638M. For the Somos® samples, the temperature and humidity were controlled as specified. The temperature and humidity of the Example parts were not controlled during testing. However, the temperature was approximately 20–22° C. and the humidity was approximately 20–30% RH.

The impact stength of all the samples was measured by the knotched Izod test, according to ASTM Test D-256A.

The physical test values for polyethylene were obtained from various sources. The values of Tensile Stress at Break, Tensile Yield Stress, Tensile Elongation at Break, Notched Izod Impact, and Tensile Modulus are for polyethylene and ethylene copolymers (low and medium density, linear copolymer) as listed in Modern Plastics Encyclopedia '98, Mid-November 1997 Issue, The McGraw-Hill Companies, Inc., New York, N.Y. The values of Tensile Elongation at Yield for polyethylene were obtained from the Internet address http://www.chemopetrol.cz/docs/en_catal/ published by Chemopetrol in Czechoslovakia. The value ranges were determined by incorporating the information from Chemopetrol's various Linten and Mosten grades of polyethylene offerings. The range of elongation at yield for polyethylene may be greater than that provided in Chemopetrol's product literature.

Examples 1–6

Compositions according to the invention were prepared having the following components, where "Meq epoxy" indicates the number of milliequivalents of epoxy per 100 grams of composition, "Meq hydroxyl" indicates the number of milliequivalents of hydroxyl per 100 grams of composition, and "Ratio" indicates the ratio of milliequivalents of epoxy to milliequivalents of hydroxyl:

| | Parts by weight | | | | | |
|---|---|---|---|---|---|---|
| Component | Ex. 1 | Ex. 2 | Ex. 3 | Ex. 4 | Ex. 5 | Ex. 6 |
| Epoxy | 37.00 | 37.30 | 39.50 | 39.65 | 36.38 | 37.38 |
| Ebecryl | 25 | 25 | 25 | 25 | 25 | 25 |
| PolyTHF | 25 | 25 | 25 | 25 | 28.5 | 27.5 |
| CHDM | | | | | | |
| FRI-1 | 4 | — | — | — | 2.8 | 2.8 |
| FRI-2 | — | 3.3 | — | — | — | — |
| FRI-3 | — | — | 1.2 | 1.45 | — | — |
| CHDMA | 7 | 7 | 7 | 7 | 7 | 7 |
| CatI | 2 | 2.4 | 2.3 | 1.9 | 0.32 | 0.32 |
| Meq epoxy | 274 | 276 | 293 | 294 | 269 | 277 |
| Meq hydroxyl | 165 | 175 | 145 | 145 | 166 | 164 |
| Ratio | 1.66 | 1.58 | 2.01 | 2.02 | 1.62 | 1.69 |

The compositions of the invention were exposed and tested as described above. Examples 1–4 were exposed at 351 nm. Examples 5 and 6 were exposed at 325 nm. The results are given in Table 1 below.

Comparative Examples C1–C2

Comparative compositions were prepared having the following components, where "Meq epoxy" indicates the number of milliequivalents of epoxy per 100 grams of composition, "Meq hydroxyl" indicates the number of milliequivalents of hydroxyl per 100 grams of composition, and "Ratio" indicates the ratio of milliequivalents of epoxy to milliequivalents of hydroxyl:

| | Parts by weight | |
|---|---|---|
| Component | C1 | C2 |
| Epoxy | 50.20 | 55.00 |
| Ebecryl | 10 | — |
| PolyTHF | 20 | 20 |
| CHDM | 2.5 | 6.0 |
| FRI-2 | 3.0 | 3.5 |
| CatI | 2.3 | 2.5 |
| TMPTA | 12 | 13 |
| Meq epoxy | 372 | 407 |
| Meq hydroxyl | 140 | 155 |
| Ratio | 2.66 | 2.64 |

The compositions were exposed and tested as described above. Samples of Somos® 2100, 3100 and 3110 were similarly exposed and tested. Comparative Examples 1 and 2 and Somos® 7100 were exposed at 351 nm. Samples of Somos® 3110 were exposed at 325 nm. Samples of Somos® 2100 were exposed using a combination of 351 and 364 nm radiation using an Argon ion laser operating with two-line output. The results are given in Table 1 below.

TABLE 1

| Property | PE | Ex. 1 | Ex. 2 | Ex. 3 | Ex. 4 | Ex. 5 |
|---|---|---|---|---|---|---|
| TYS | 13–28 | 27 | 23 | 24 | 28 | 17 |
| TMod | 260–520 | 275–620 | 533 | 625 | 820 | 400 |
| TYE % | 6–8 | 21.4 | 24.9 | 26.6 | 25.4 | 18 |
| Izod | 53.4+ | 57 | 70 | N/A | 66 | N/A |
| Energy | N/A | 31 | 50 | 35 | 36 | 47 |

| Property | Ex. 6 | C1 | C2 | 2100 | 3110 | 7100 |
|---|---|---|---|---|---|---|
| TYS | 24 | 33 | 45 | 9 | 26 | 62 |
| TMod | 745 | 1282 | 1651 | 90 | 1282 | 2068 |
| TYE % | 17 | 4.8 | 4.7 | 37 | 5.7 | 4.7 |
| Izod | N/A | N/A | 52 | 90 | 16 | 29 |
| Energy | 48 | 43 | 41 | 13 | 18 | 59 |

TYE = tensile yield stress in N/mm$^2$
TMod = tensile modulus in N/mm$^2$
TYE % = tensile yield elongation; for all samples the yield elongation was less than or equal to the break elongation
Izod = notched Izod impact strength in J/m
Energy = energy to produce a 0.01 inch (0.254 mm) layer in mJ/cm$^2$
N/A = not tested The formulations in Examples 1 and 5 produced hazy parts that looked just like low to medium density polyethylene. Lower exposures, such as, for example, 31 mJ/cm$^2$, during the solid imaging process, produced parts that were hazier and softer, similar to lower density polyethylenes. Higher exposures, such as, for example, 62 mJ/cm$^2$, during the solid imaging process, produced parts that had less haze and were harder, similar to medium density polyethylenes. The tensile stress at yield was favorable for Examples 1 and 5 as a simulation material for polyethylene. The tensile modulus range for Example 1 was a surprisingly good match for polyethylene. Example 5 will exhibit a similar match for the tensile modulus range of polyethylene. The tensile break and yield strain values of articles made from Examples 1 and 5 were more than adequate in order to simulate polyethylene articles. The notched Izod impact strength of Example 1 parts was near the low end, but within the range of polyethylenes. Overall, both were excellent simulation materials for polyethylene.

The formulations from Examples 2–4 and 6 also met most of the criteria to be good simulation materials for polyethylene. The tensile modulii were higher than the polyethylene range, but acceptable as a simulation material. Lower exposures during the solid imaging phase of fabrication would result in lowering the modulus allowing all to be good candidates as simulation materials for polyethylene.

The formulations in Examples 5 and 6 were variations of Example 1 wherein the compositions contained initiator concentrations suitable for use with a He—Cd laser operating at 325 nm in a solid imaging process. The variations in the Examples involved increases in the 3,4-epoxycyclohexylmethyl-3,4-epoxycyclohexane carboxylate content with a concurrent decrease in the polytetrahydrofuran linear chain (1000 NW) content. As can be seen from Table 1, small variations in the 3,4-epoxycyclohexylmethyl-3,4-epoxycyclohexane carboxylate content have a remarkable effect on the tensile modulus. This effect is shown graphically in FIG. 2.

Parts made from the formulations of Comparative Examples C1 and C2 were very stiff. The tensile yield stress and tensile modulus for both Comparative Examples was much higher than that of polyethylene. In addition, the tensile yield elongation was unacceptably low. Therefore, Comparative Examples C1 and C2 are not acceptable as simulation materials for polyethylene.

Somos® 2100 parts generally appeared milky white. On an appearance basis therefore, it is not desirable as a simulation material for polyethylene. When comparing the yield and break tensile stress measurements for Somos® 2100 against the corresponding values for polyethylene, it can be seen that Somos® 2100 is too weak. Therefore, Somo® 2100 is regarded as not suitable as a simulation material for polyethylene.

Parts made from Somos® 3110 and 7100 were significantly more clear than those made of polyethylene and the parts made from these materials had tensile modulii that were much too high. In addition, the tensile yield elongation was too low to simulate polyethylene. Therefore, these commerical products also are regarded as not suitable as simulation materials for polyethylene.

What is claimed is:

1. A photosensitive composition comprising:
   (a) from about 20 to 37.00% by weight of an epoxide-containing material;
   (b) about 5–40% by weight of acrylic material selected from aromatic acrylic material, cycloaliphatic material, or combinations thereof;
   (c) about 5–50% by weight of a reactive hydroxyl-containing material;
   (d) at least one cationic photoinitiator; and
   (e) at least one free-radical photoinitiator;
   wherein said composition, after cure by exposure to actinic radiation and optionally heat, has the following properties:
   (i) a tensile break before yield stress or a tensile yield stress greater than 13 N/mm$^2$;
   (ii) a tensile modulus in the range of about 180 to about 850 N/mm$^2$;
   (iii) a tensile break elongation before yield or a tensile yield elongation greater than 6%; and
   (iv) a notched Izod impact strength greater than 50 J/m.

2. The composition of claim 1, wherein said compositions after cure, has a cloudy appearance that simulates polyethylene.

3. The composition of claim 1 wherein the epoxide-containing material is selected from bis(4-hydroxycyclohexyl)methane diglycidyl ether; 2,2-bis(4-hydroxycyclohexyl)propane diglycidyl ether; 3,4-epoxycyclohexylmethyl-3,4 epoxycyclohexanecarboxylate; 3,4- epoxy-6-methyl-cyclohexylmethyl-3,4-epoxy-6-methylcyclohexanecarboxylate; di-(3,4-epoxycyclohexylmethyl)hexanedioate; di-(3,4-epoxy-6-methyl-cyclohexylmethyl)hexanedioate; ethylenebis(3,4-epoxycyclohexanecarboxylate); ethanediol-di-(3,4-epoxycyclohexylmethyl) ether; 2-(3,4-epoxycyclohexyl-5,5-spiro-3,4-epoxy)cyclohexane-1,3-dioxane; and combinations thereof.

4. The composition of claim 1 wherein the acrylic material is selected from 1,4-dihydroxymethylcyclohexane diacrylate; bisphenol A diacrylate; ethoxylated bisphenol A diacrylate; and combinations thereof.

5. The composition of claim 1 wherein the free-radical photoinitiator is a 1-hydroxyphenyl ketone.

6. The composition of claim 1, wherein said composition, after cure, has a tensile modulus in the range of from about 220 to about 650 N/mm$^2$.

7. A photosensitive composition comprising:
   (a) at least about 20% by weight of an epoxide-containing material;
   (b) about 5–40% by weight of an aromatic acrylic or cycloaliphatic acrylic material;
   (c) at least about 5% by weight of a reactive hydroxyl-containing material;
   (d) at least one cationic photoinitiator; and
   (e) at least one free-radical photoinitiator;
   wherein the composition comprises from about 250 to about 350 milliequivalents of epoxy per 100 grams of composition and from about 140 to about 180 milliequivalents of hydroxyl per 100 grams of composition, wherein said composition, after cure by exposure to actinic radiation and optionally heat, has the following properties:
   (i) a tensile break before yield stress or a tensile yield stress greater than 13 Nlmm$^2$;
   (ii) a tensile modulus in the range of about 180 to about 850 N/mm$^2$;
   (iii) a tensile break elongation before yield or a tensile yield elongation greater than 6%; and
   (iv) a notched Izod impact strength greater than 50 J/m.

8. The composition of claim 7 wherein the reactive hydroxyl-containing material is selected from 1,4-cyclohexanedimethanol; polytetrahydrofuran polyether polyols; and combinations thereof.

9. The composition of claim 7 wherein the ratio of milliequivalents of epoxy to milliequivalents of hydroxyl is in the range of about 1.5 to 2.5.

10. The composition of claim 7, wherein said tensile modulus is in the range of about 220 to about 650 N/mm$^2$.

11. A photosensitive composition comprising:
   (a) about 20–40% by weight of an epoxide-containing material;
   (b) about 5–40% by weight of acrylic material selected from aromatic acrylic material, cycloaliphatic material, or combinations thereof;
   (c) about 5–50% by weight of at least one reactive hydroxyl-containing compound selected from 1,4- cyclohexanedimethanol, polytetrahydrofuran polyether polyols, and combinations thereof;
(d) at least one cationic photoinitiator; and
(e) at least one free-radical photoinitiator;
wherein said composition, after cure by exposure to actinic radiation and optionally heat, has the following properties:
(i) a tensile break before yield stress or a tensile yield stress greater than 13 N/mm$^2$;
(ii) a tensile modulus in the range of about 180 to about 850 N/mm$^2$;
(iii) a tensile break elongation before yield or a tensile yield elongation greater than 6%; and
(iv) a notched Izod impact strength greater than 50 J/m.

12. The composition of claim 11, wherein said tensile modulus is in the range of about 220 to about 650 N/mm$^2$.

* * * * *